US007804436B2

(12) United States Patent
Hales et al.

(10) Patent No.: US 7,804,436 B2
(45) Date of Patent: Sep. 28, 2010

(54) CURRENT MODE ANALOG-TO-DIGITAL CONVERTER

(75) Inventors: Rex K. Hales, Riverton, UT (US); Marcellus C. Harper, Kaysville, UT (US)

(73) Assignee: SiFlare, Inc, Sandy, UT (US)

( * ) Notice: Subject to any disclaimer, the term of this patent is extended or adjusted under 35 U.S.C. 154(b) by 0 days.

(21) Appl. No.: 11/782,955

(22) Filed: Jul. 25, 2007

(65) Prior Publication Data

US 2008/0048644 A1 Feb. 28, 2008

Related U.S. Application Data

(60) Provisional application No. 60/820,393, filed on Jul. 26, 2006.

(51) Int. Cl.
*H03M 1/12* (2006.01)
(52) U.S. Cl. ...................................... 341/155; 341/156
(58) Field of Classification Search ................. 341/155, 341/144, 127, 156, 120; 340/870.02
See application file for complete search history.

(56) References Cited

U.S. PATENT DOCUMENTS

| 5,289,191 | A | * | 2/1994 | Elms ........................... 341/127 |
| 5,579,006 | A | | 11/1996 | Hasegawa et al. |
| 5,963,158 | A | | 10/1999 | Yasuda |
| 6,150,967 | A | * | 11/2000 | Nakamura ................... 341/135 |
| 6,768,282 | B2 | * | 7/2004 | Lutter et al. ................. 318/603 |
| 7,081,845 | B2 | | 7/2006 | Hales et al. |
| 7,098,837 | B2 | * | 8/2006 | Suzuki et al. ............... 341/155 |
| 2005/0104744 | A1 | * | 5/2005 | Patterson et al. ....... 340/870.02 |
| 2006/0158362 | A1 | * | 7/2006 | Shimizu et al. ............. 341/144 |

* cited by examiner

*Primary Examiner*—Rexford N Barnie
*Assistant Examiner*—Joseph Lauture
(74) *Attorney, Agent, or Firm*—Steven L. Nichols; Vancott, Bagley, Cornwall & McCarthy PC

(57) ABSTRACT

A current measuring system has an electrical component configured to provide an electrical current representative of a parameter of interest at an output node; and an analog to digital converter having a current input node in electrical communication with the output node of the electrical component.

20 Claims, 10 Drawing Sheets

US 7,804,436 B2

CURRENT MODE ANALOG-TO-DIGITAL CONVERTER

CROSS-REFERENCE TO RELATED APPLICATION

The present application claims priority under 35 U.S.C. §119(e) to U.S. Provisional Patent Application No. 60/820,393, by Rex K. Hales et al., filed on Jul. 26, 2006, and entitled "System and Method of Using a Current Mode Analog-to-Digital Converter", which is incorporated herein by reference in its entirety.

BACKGROUND

Historically, engineers have been trained to design circuits in terms of voltage. While analyzing circuits, a designer typically concentrates on the voltage at each node. When doing integrated circuit analysis, designers look at the voltage change on the output due to a voltage change on the Input. Circuit simulators also follow this approach by constructing matrices of nodes to solve for node voltages. On the test bench, voltage sources are used to operate circuits under test, and test equipment measures voltage.

Over the years, integrated circuits have seen incredible increases in density. With each reduction in feature size, there has also been a reduction in optimal operating voltage. These decreases in operating voltage have required reductions in threshold voltages in an attempt to maintain noise margins. Analog circuits, particularly analog-to-digital converters (ADCs) have suffered from this reduction, and are typically designed with higher voltage transistors and operating voltages than are available to digital designers.

In a typical voltage mode ADC, the voltage being sampled is stored on a capacitor. It can be shown that the minimum size of the capacitor storing the voltage must be $>kT/(V_n^2)$, where k is Boltzman's constant, T is temperature in Kelvin, and Vn is the size of the largest noise signal, usually less than ¼ of the ADC's least significant bit (LSB), that can be tolerated to give a low probability of error. As the operating voltage is reduced due to newer processes, the minimum capacitor size increases. This increases both the size of the circuit and the power used.

The accuracy of a voltage mode circuit, including a voltage mode ADC, is determined by the size of the capacitance used to store the voltage. The speed of a voltage mode circuit is consequently affected by circuit capacitance and parasitic capacitance. The nodes of a voltage mode circuit must change voltage during operation of the circuit over a range that is often approximately the entire voltage range of the power supply voltage. Changing the voltage requires that the circuit and parasitic capacitances must charge and discharge. Smaller integrated circuit geometries have been able to reduce circuit capacitance, at the cost of smaller supply voltages, which has a negative impact on noise margins.

BRIEF DESCRIPTION OF THE DRAWINGS

The accompanying drawings illustrate various embodiments of the principles described herein and are a part of the specification. The illustrated embodiments are merely examples and do not limit the scope of the disclosure.

FIG. 9A illustrates an exemplary battery charging application that includes a current mode ADC according to principles described herein.

Throughout the drawings, identical reference numbers designate similar, but not necessarily identical, elements.

DETAILED DESCRIPTION

Figure 1:
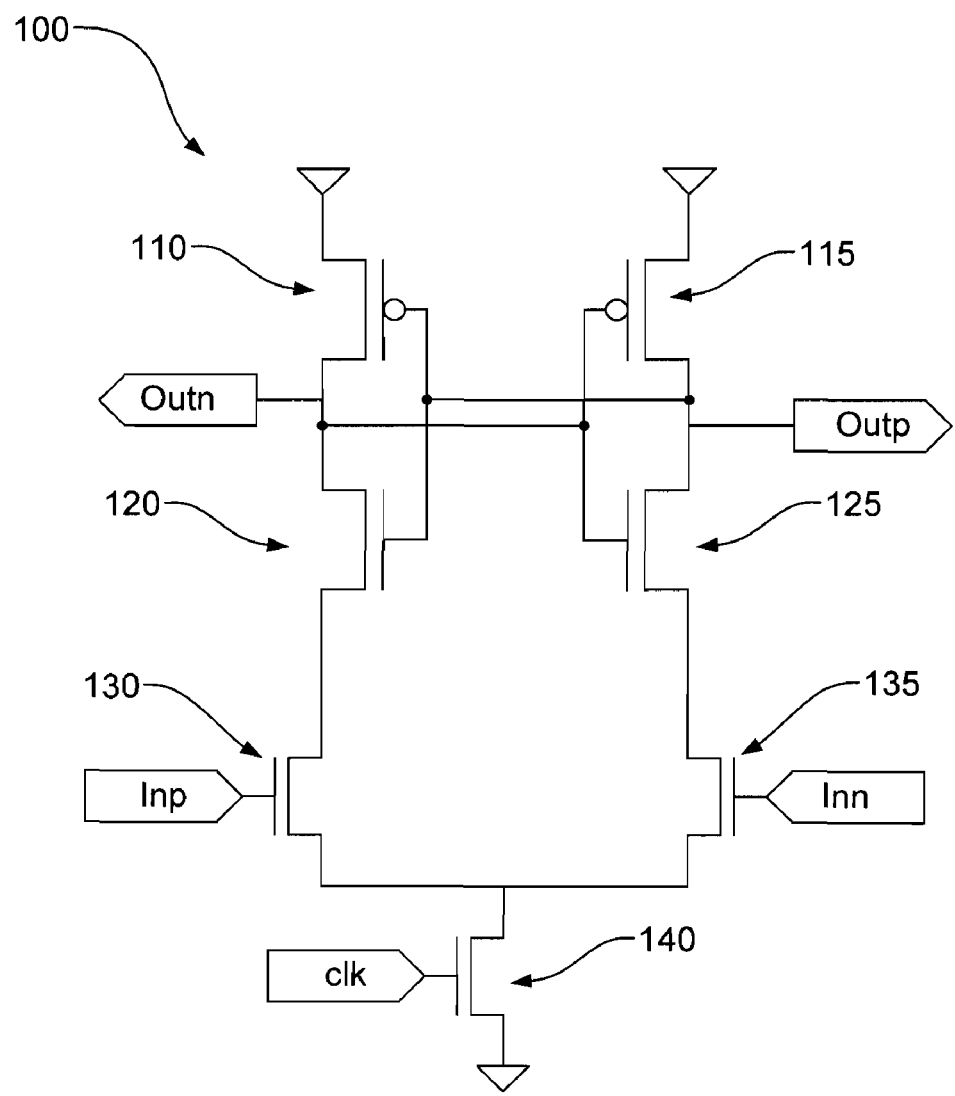
FIG. 1 shows a simplified schematic of a sense amplifier comparator according to principles described herein.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

As mentioned above, past and present electronics industries have overwhelmingly designed and maintained products in terms of voltage. Hence, voltage mode has long been established as the accepted implementation of devices performing conversion of analog signals to digital output signals. However, in many design applications involving these analog-to-digital converters (ADCs), a current output by an electrical component or system must first be converted to a voltage before it can be measured by an ADC. This conversion of currents to voltages typically expends a relatively large amount of power in relation to the power consumption of the ADC itself. Moreover, additional electronic components are generally required to perform the conversion, thus complicating circuit designs and increasing costs, and often taking up valuable board space.

The present specification describes, among other things, exemplary implementations for current mode ADCs. As will be described in more detail below, the use of a current mode ADC having current input is advantageous in many systems and often results in reduced power consumption, fewer components, lower cost, faster operating speeds, simplified layout, and higher accuracy.

In some examples, as will be described in more detail below, a current input current mode ADC operates, for example, by comparing an input current to one or more reference currents to create a digital representation of the incoming signal. The ADC described herein may be used in a variety of applications including but not limited to, battery level measurement (metering), communications, imaging, measurement, control systems, sensors, etc.

As described above, traditional circuit design is done in terms of voltage. Circuits are designed in terms of voltage merely for the convenience for the typical designer. For example, in the field of analog-to-digital conversion, voltage mode ADC's compare an input voltage to reference voltages to determine which reference voltage is closest to the value of the Input. A digital representation of the input signal is then created based on a series of such voltage comparisons.

However, there are several advantages to designing circuits in terms of current. As will be described in more detail below, an input current may be compared to a set of current references to determine which reference current is closest to the input current. A digital representation of the input signal may then be created based on a series of such current comparisons.

One of the many values of this approach is that, since current sources are used rather than voltage references, operational voltage becomes far less important. By allowing lower operating voltages to be used, the ADC can take better advantage of the increases in modern integrated circuit density. Also, since the voltages at nodes in a current mode circuit change very little, circuit and parasitic capacitances have much less effect on the speed of the circuit.

An exemplary design of a current mode ADC suitable for use with the principles of the present specification will now be described in more detail for illustratory and enablement purposes. However, those skilled in the art will recognize that any of many embodiments of current mode ADCs may be used in conjunction with the principles of the present specification.

As described herein, a current based ADC design uses a comparator that is configured to compare two currents and output a digital value dependent on which current is larger. The sense amplifier, which has been used in Random Access Memory (RAM) technology, can provide such a comparator. Sense amplifiers are traditionally used to differentially compare true and complement outputs of a RAM bit to determine its value on read.

Since the sense amplifier compares current values differentially, problems with parasitic capacitances on the bit lines are avoided. Current differences can be detected accurately at very high speeds without the need to wait for the voltages to slew to final values, the timing of which is very sensitive to parasitic capacitance.

In a specific example described herein, a current mode flash ADC is composed of 2^N sense amplifier comparators and current references, where N is the number of bits output for each comparison. This flash ADC can also be used as a building block in other types of ADCs such as a sub-ranging ADC, pipelined ADC, Sigma-Delta Modulator, Successive Approximation ADC and others.

The exemplary current mode flash ADC may be embodied as a 4-bit ADC with the ability for conversion of analog-to-digital signals at a rate of 1 Giga-Sample per Second (GSPS). This ADC is composed of 16 differential current comparators. The reference Inputs are composed of 16 current sources generated by mirroring current from a single current source. Since it is a flash ADC, the value of the Input does not have to be stored, therefore there are no capacitors required by the design. The current comparators and current mirrors can be easily scaled according to process geometries. Since the ADC is based on current, it has little dependence on the value of the power supply voltage.

Referring to FIG. 1, a simplified schematic of an exemplary sense amplifier comparator (100) is shown. The comparator is able to detect very small voltage changes on input nodes (Inp and Inn) Typically in a RAM application, the input nodes (Inp and Inn) are charged to a supply voltage while a clock node (clk) is held low. When clk goes high, Inp or Inn starts to change voltage as the RAM cell discharges the capacitance of the Inp or Inn signal. At the same time the NMOS transistor (140) turns on and causes a current to start flowing in transistors (130) and (135). This current is proportional to the voltage at the gates of transistors (130) and (135). NMOS transistor (120) and NMOS transistors (110) together form an inverter with the output labeled Outn and the input as Outp. NMOS transistor (125) and NMOS transistor (115) form an inverter with the output labeled Outp and input as Outn. These transistors provide positive feedback that gives the circuit much higher gain than just the gain of the differential pair formed by transistors (130) and (135).

Figure 2:
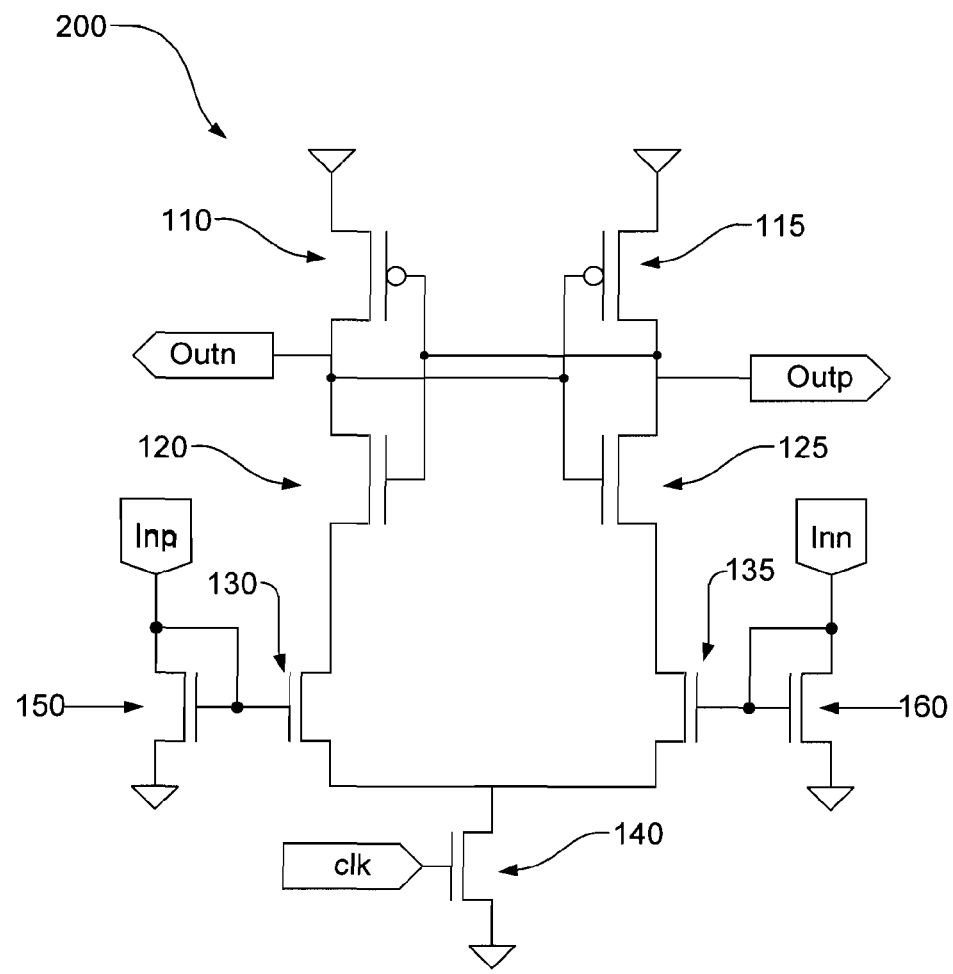
FIG. 2 shows a modification of the sense amplifier comparator of FIG. 1 including a current mirror according to principles described herein.

FIG. 2 shows a modification of the sense amplifier of FIG. 1 which gives a simple current mirror Input to the sense amplifier comparator. NMOS transistors (150) and (160) have been added to the sense amplifier comparator shown previously in FIG. 1 to form a current mirror configuration with transistor (130) and transistor (135), respectively. When clk is high, the current in transistor (130) will be the same as transistor (150) due to both transistors having the same gate voltage and nearly the same source voltage, as the source voltage of transistor (130) is pulled nearly to ground by NMOS transistor (140). By the same token, the current in transistor (135) will be the same as transistor (160). Hence, the configuration shown in FIG. 2 may be used directly as a current comparator.

As explained above, the comparator of FIG. 2 can be used to give a digital output at Outp of "1" or "high" if the current into the Inp input is greater than the current into the Inn input. As will be described below, this current comparator may be used in a current mode ADC.

Figure 3:
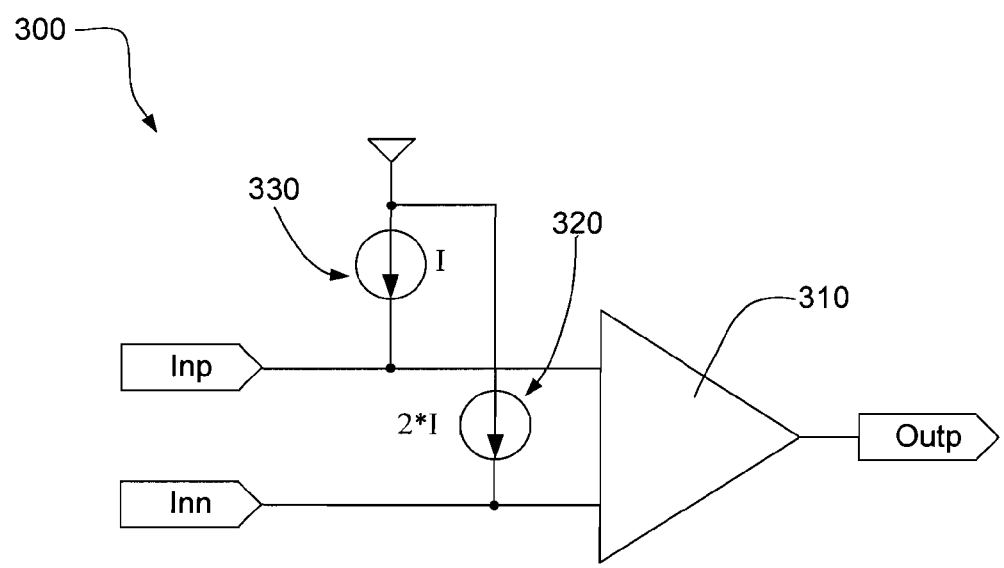
FIG. 3 shows the modified sense amplifier comparator of FIG. 2 as a block with current sources used to adjust current levels according to principles described herein.

FIG. 3 shows the comparator of FIG. 2 as a current comparator block (310). Current sources (320) and (330) add electrical current to the currents in the Inp and Inn Inputs. These additional currents, as shown in the present example, are set to provide thresholds for the comparator so that the current into Inp must be two or more times greater than the current coming in from Inn for the comparator to be high. In other embodiments, the current sources (320, 330) may be set such that the current into Inp must be greater than some other multiple of the current into Inn. This principle can be used to create an ADC that uses currents for references.

Figure 4:
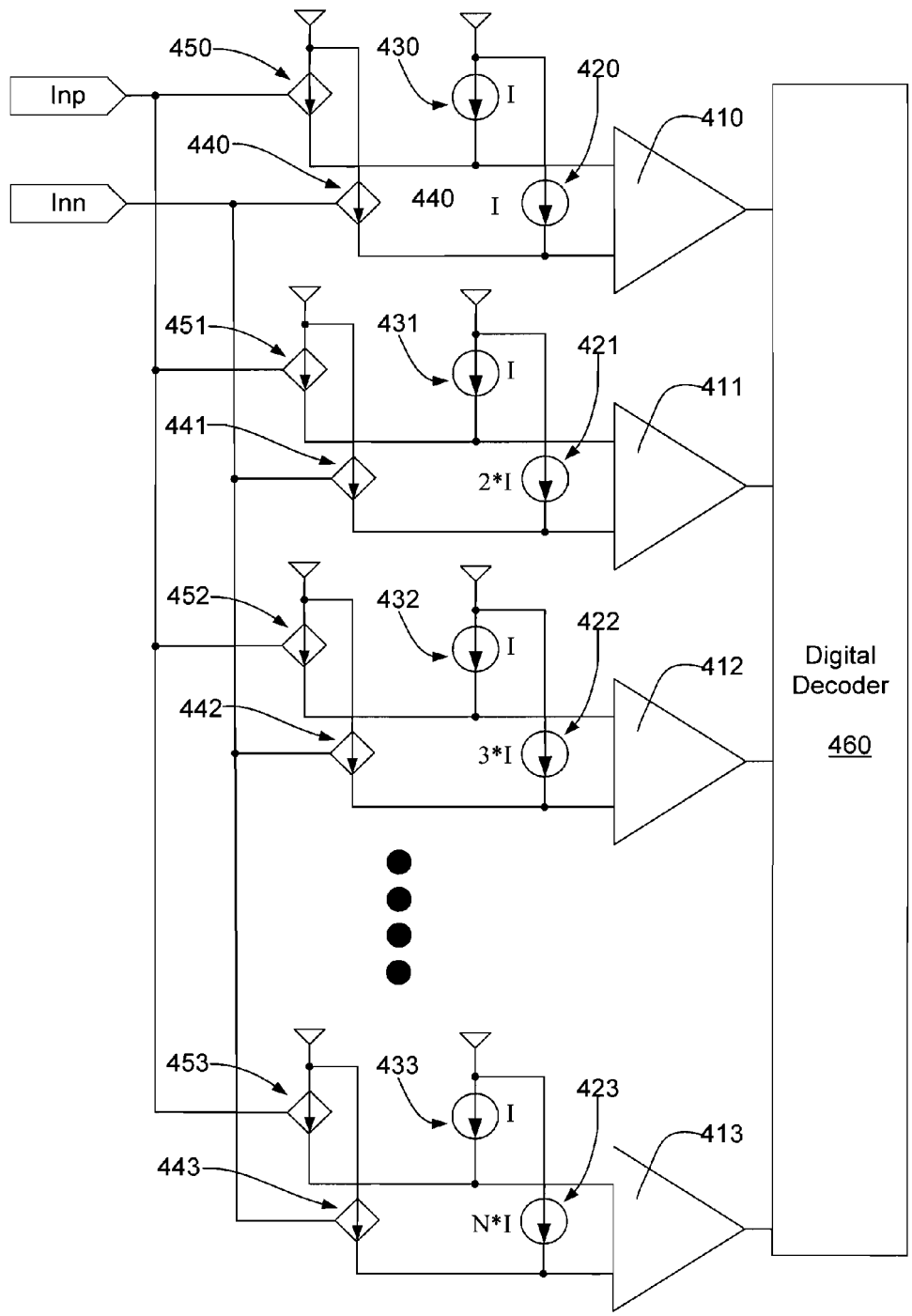
FIG. 4 shows a current mode ADC according to principles described herein.

FIG. 4 shows an n bit, current mode ADC. Current comparators (410), (411), (412) and (413) are connected to a digital decoder (460). The comparator of FIG. 2 may be used as the comparators (410-413). The comparators (410-413) take current inputs and convert them to a digital output as described above. Elements (430), (431), (432), and (433) are current sources that add a DC bias to the input signal. Elements (420), (421), (422), and (423) are current sources with output currents scaled from I to N*I, where N is equal to 2^n. Because the inputs to the comparators (430-433) are currents, elements (440), (441), (442), and (443) are current controlled current sources having current equal to Inp and Inn respectively, to allow for combining the currents into the comparators.

The digital decoder (460) shown in FIG. 4 is a digital, thermometer code to binary converter which takes the data from the N comparators and converts the data into an n bit binary signal. The digital decoder (460) may also contain error detection or correction circuitry.

Additional details related to current mode ADCs are described more fully in U.S. Patent Publication 20060017598, entitled "Current Mode Analog-to-Digital Converter," which publication is incorporated herein by reference in its entirety.

A number of exemplary systems utilizing current mode ADCs will now be described. These systems are based on three basic embodiments of the ADC input stage. In the first of these embodiments, an ADC has two inputs—an Ipos (positive input current) and an Ineg (negative input current), where the current being measured flows between Ipos and Ineg with an impedance close to 0 ohms (i.e. externally the nodes appear to be shorted together). The second of these embodiments is similar to the first, except the impedance between Ipos and Ineg is controlled to a value that can create a current divider with an external impedance. Using this type of stage, impedance matching can be done, as well as measurement of very large currents, where the full current now does not have to flow through the ADC to be measured. The third embodiment is an ADC with an input stage wherein the impedance between Ipos and Ineg is very high. The currents do not flow directly between the nodes. In this case the current measured is Ipos minus Ineg, but Ipos does not have to be equal and opposite of Ineg. The following systems describe uses for these types of input stages.

It is to be understood that the current mode ADC described in FIGS. 1-3 is by way of example only, and many other embodiments of current mode ADCs are suitable and contemplated for use with the systems and methods of the present specification.

Figure 5A:
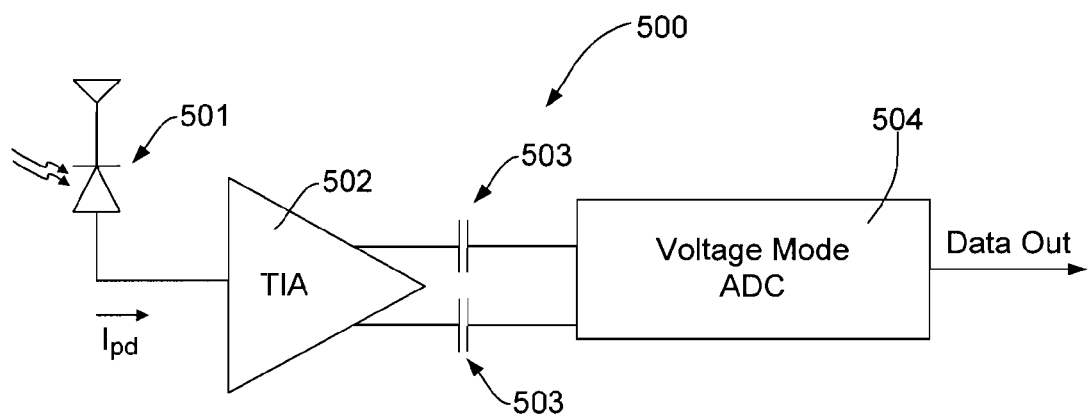
FIG. 5A illustrates an exemplary photodiode system according to principles described herein.

FIG. 5A illustrates an exemplary photodiode detection system (500) that uses a standard voltage mode ADC (504). As shown in FIG. 5A, the system (500) includes a photodiode (501) in communication with an input node of a trans-impedance amplifier (TIA) (502). The photodiode detection system (500) also includes series capacitors (503) in communication with output nodes of the transimpedance amplifier (502) and input nodes of the standard voltage mode ADC (504). Photodiodes (501) are used in many fiber optic implementations, for example.

However, as shown in FIG. 5A, current (Ipd) is inherently output from the photodiode (501). This current typically has a small signal level, and therefore has to be amplified by the amplifier (502) and converted into a voltage prior to being input into the ADC (504). Hence, in some examples, a current mode ADC may be used in place of the standard ADC (504) in order to obviate the need for the amplifier (502).

Figure 5B:
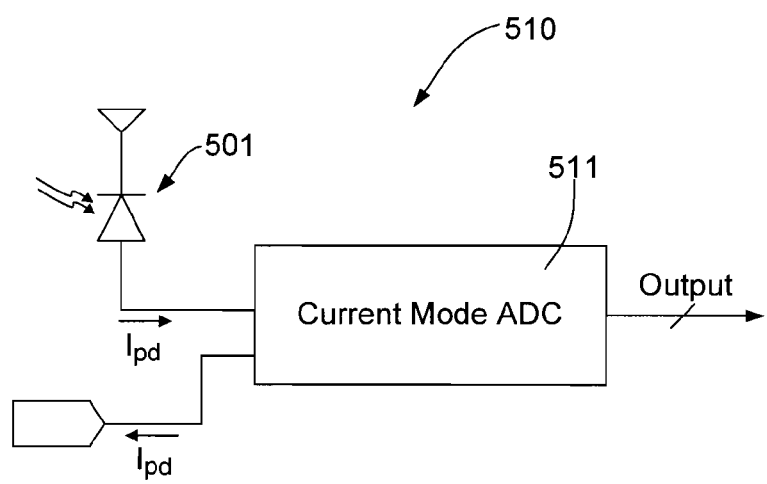
FIG. 5B illustrates an exemplary photodiode system that uses a current mode ADC according to principles described herein.

Therefore, as shown in FIG. 5B, a current mode ADC (511) may be included within a photodiode detection system (510). The current mode ADC (511) is configured to be able to receive input current signals without the need for amplification or voltage conversion. Hence, the number of components required in the system is reduced, less power is consumed, higher operating speeds are possible, and higher accuracy may be achieved.

The current mode ADC (511) is configured to receive the current (Ipd) produced by a photodiode (501) at an input node of the current mode ADC (511). A reference current (not shown) may also be received at an input node of the current mode ADC (511). The current mode ADC (511) is configured to output a binary electronic signal indicative of the amount of current measured from the photodiode (501).

Figure 6A:
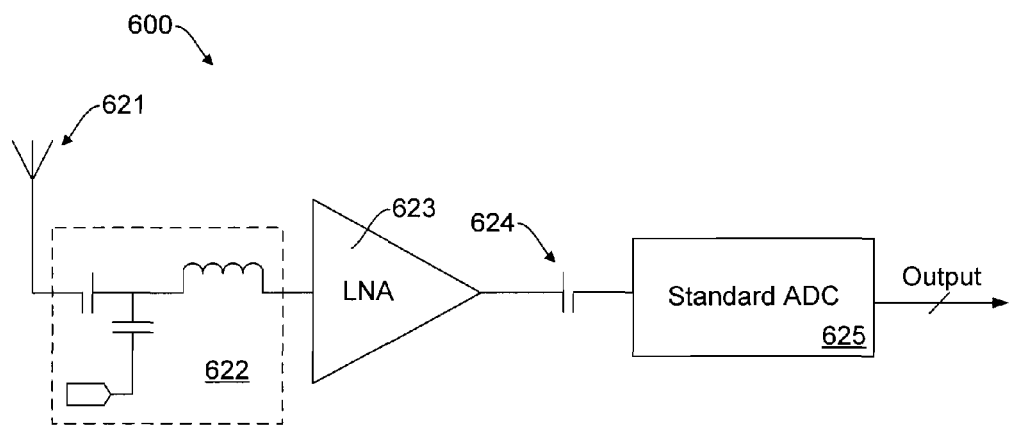
FIG. 6A illustrates an exemplary receiver system according to principles described herein.

FIG. 6A illustrates an exemplary receiver system (600) configured to receive one or more radio antennal signals. As shown in FIG. 6A, the exemplary system (600) includes an antenna (621) in communication with filter circuitry (622) and a low noise amplifier (LNA) (623) configured to receive a filtered electrical signal from the antenna (621). A series capacitor (624) is disposed intermediate, and in electrical communication with an output of the LNA (623) and an input of a standard voltage-mode ADC (625). As shown in FIG. 6A, the signal received by the antenna (621) typically has to be amplified with a low noise amplifier (623) and then converted into voltages prior to being input into the ADC (625).

Figure 6B:
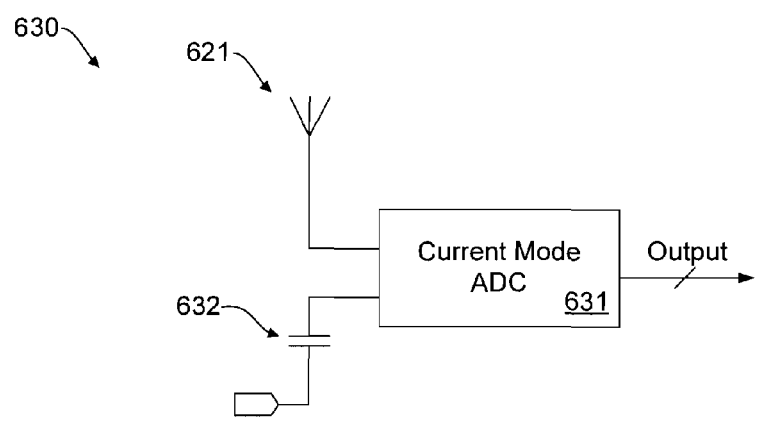
FIG. 6B illustrates an exemplary receiver system that includes a current mode ADC according to principles described herein.

FIG. 6B illustrates an exemplary receiver system (630) that includes a current mode ADC (631). In some examples, the current mode ADC (631) may configured to have a controlled impedance to allow for radio signals received by the antenna (621) to be input directly into the ADC (631). Hence, the need for the LNA (623) is obviated, system layout is simplified, and overall cost of the system is reduced.

Figure 7A:
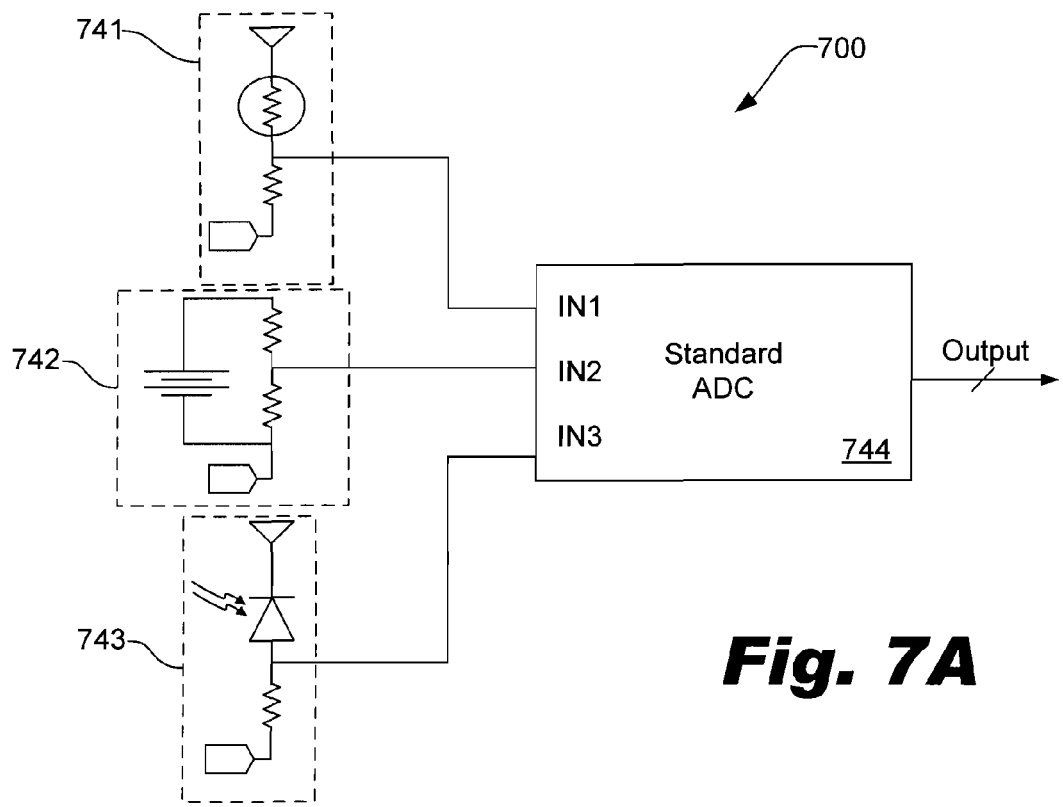
FIG. 7A illustrates an exemplary embedded system according to principles described herein.

FIG. 7A illustrates an exemplary embedded system (700) that uses a standard voltage mode ADC (744). Such an embedded system (700) may be included in many different types of electronic devices such as, but not limited to, handheld devices (e.g., personal digital assistants (PDAs)), laptops, and others. As shown in FIG. 7A, the embedded system (700) may include a number of components configured to perform different functions. For example, temperature circuitry (741) may be used to sense internal temperature, battery level circuitry (742) may be used to sense the battery level of the device, and an ambient light sensor (743) may be configured to sense the level of ambient light and adjust the intensity of the device's display accordingly. An output from each circuit may then be input into the standard ADC (744) after being converted to voltages using resistors.

Figure 7B:
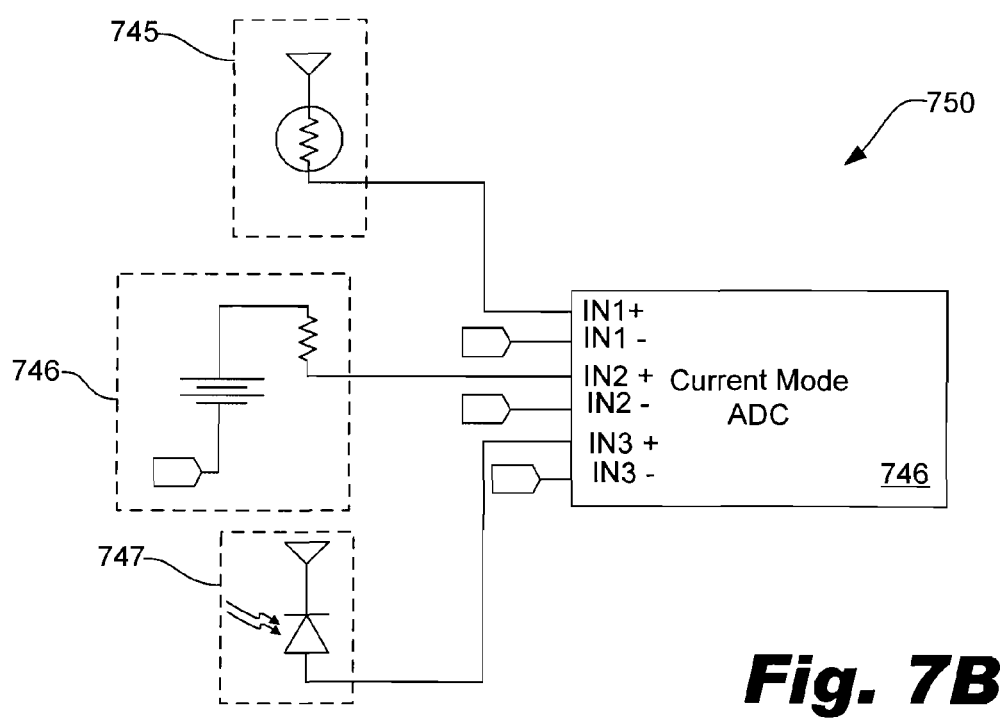
FIG. 7B illustrates an exemplary embedded system that includes a current mode ADC according to principles described herein.

FIG. 7B illustrates an exemplary embedded system (750) with a current mode ADC (746) contained therein. The current mode ADC (746) allows fewer components to be used, saves space, lowers cost, and improves accuracy. The current mode ADC (750) does not require current signals to be converted to voltage signals prior to sensing the signals. Hence, additional resistors need not be used in temperature circuitry (745), battery level circuitry (746), and ambient light detection circuitry (747) having components configured to output a level of electric current relative to corresponding parameters of interest.

Figure 8A:
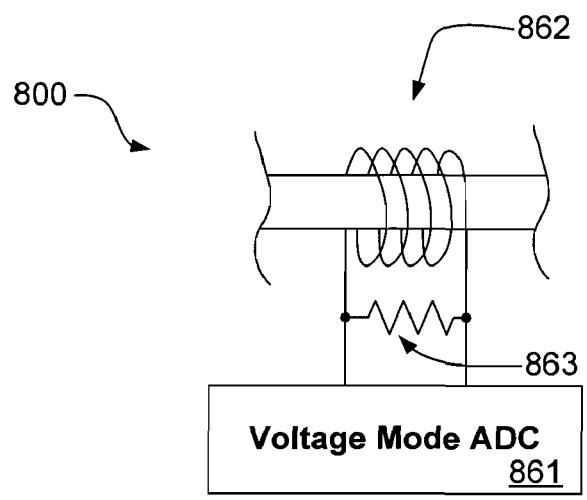
FIG. 8A illustrates an exemplary AC power metering system according to principles described herein.

FIG. 8A illustrates an exemplary AC power metering system (800) that includes a standard voltage mode ADC (861). To generate enough voltage for correct and accurate operation of a voltage mode ADC (861), an expensive current mode transformer (862) with a relatively large number of windings must be used. For high power, this also results in a potentially large load resistor (863).

Figure 8B:
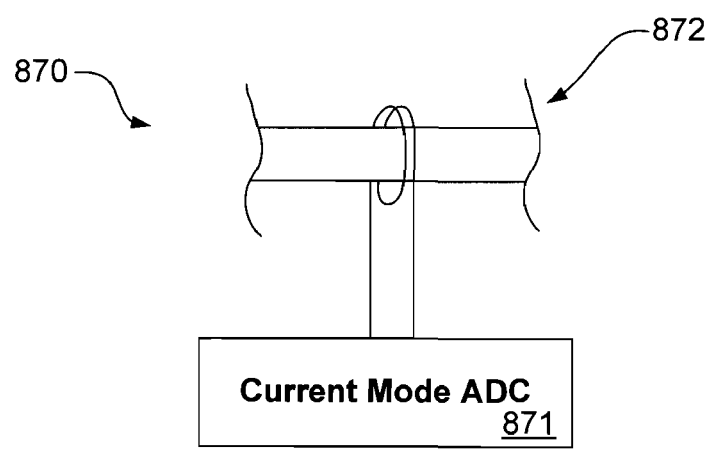
FIG. 8B illustrates an exemplary AC power metering system that includes a current mode ADC according to principles described herein.

However, FIG. 8B illustrates an exemplary AC power metering system (870) that uses a current mode ADC (871). Because the current mode ADC (871) can accurately read even very small currents, the current transformer (872) only has to have a relatively few number of windings. Thus, the AC power metering system (870) of FIG. 8B provides a much more inexpensive and efficient solution than the system (800) shown in FIG. 8A.

Figure 9A:
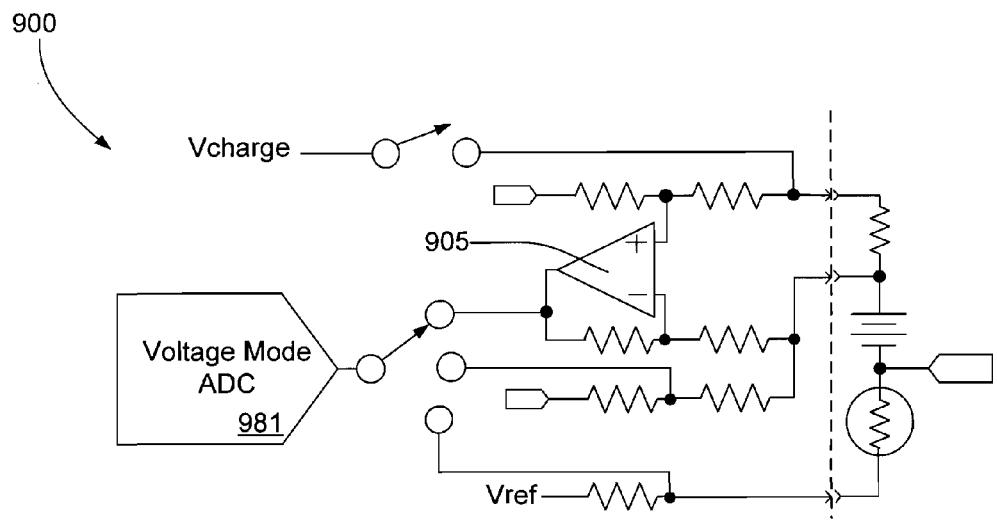
FIG. 9A illustrates an exemplary battery charging application according to principles described herein.

FIG. 9A illustrates an exemplary battery charging application (900) that includes a standard voltage mode ADC (981). As a battery (910) is charged by Vcharge, voltage signals converted from current derived from the battery (910) and a temperature sensor (915) may be selectively measured by the voltage mode ADC (981) using switches. The exemplary system (900) requires an amplifier (905) to provide a correct voltage sample at the voltage mode ADC (981). The amplifier (905) and additional resistors are required to convert the current signals from the battery (910) and the temperature sensor (915) to voltage signals that may be measured by the voltage mode ADC (981).

Figure 9B:
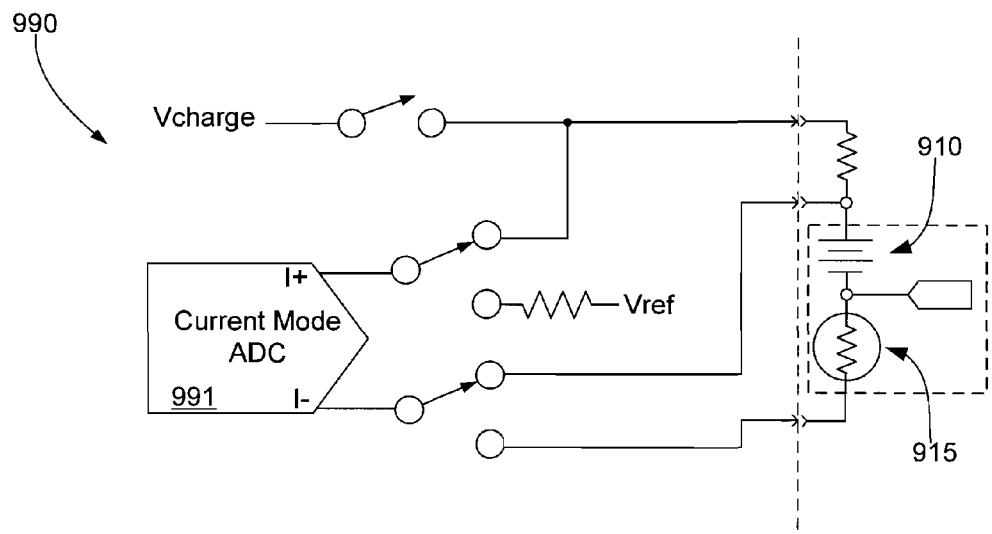

FIG. 9B illustrates an exemplary battery charging application (990) that includes a current mode ADC (991). As shown in the figures, the current mode ADC (991) reduces the required amount of circuitry by accepting current signals directly from the battery (910) and temperature sensor (915) circuits. Moreover, current may be measured in parallel with a current limiting resistor (992) and Voltage and Temperature measurements may be performed with I+ switched to Vref.

Figure 10:
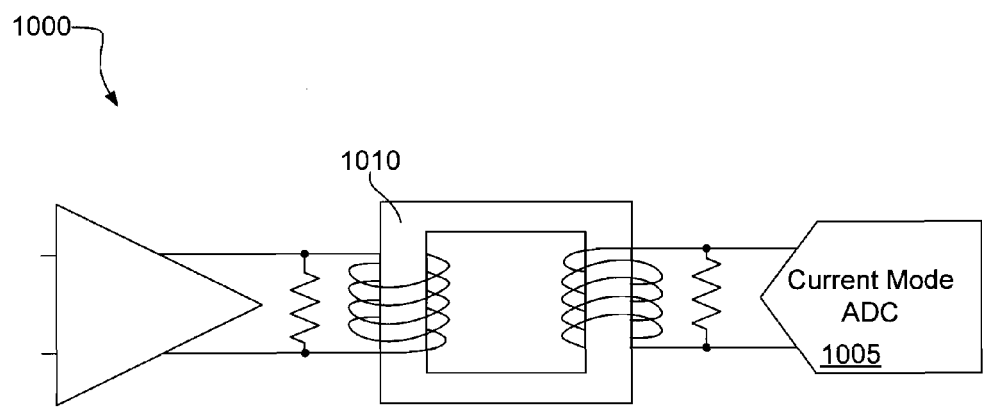
FIGS. 10-11 illustrate additional or alternative systems in which current mode ADCs may be used according to principles described herein.
Figure 11:
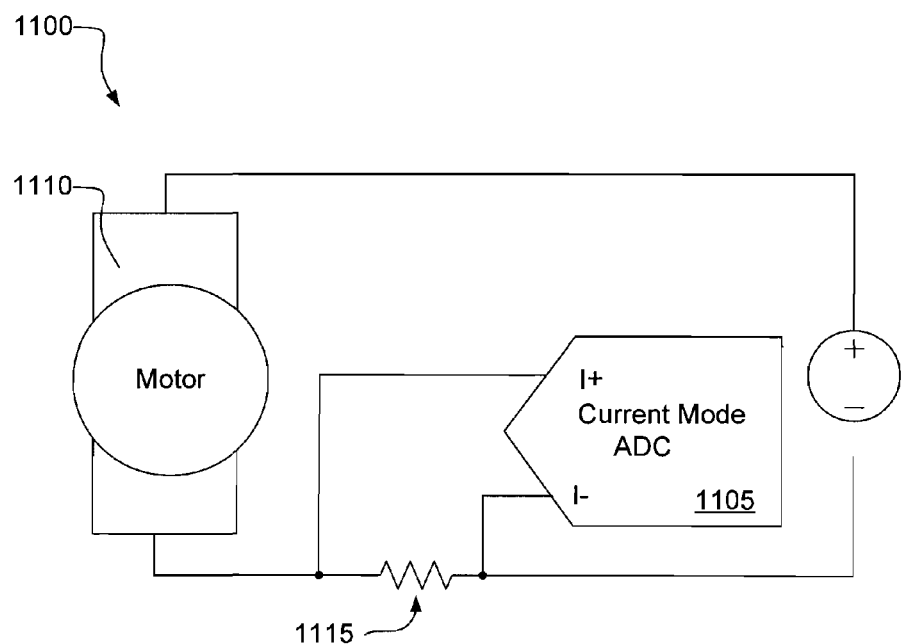

FIGS. 10-11 illustrate additional or alternative systems in which current mode ADCs may be used. For example, as shown in FIG. 10, an exemplary system (1000) includes a current mode ADC (1005) configured for use in transformer-based differential signal applications. The current mode ADC (1005) has an input impedance that may be designed to impedance match high frequency signals, such as those coming from a transformer (1010).

FIG. 11 illustrates an exemplary configuration wherein a current mode ADC (1105) is used in a DC motor monitoring system. Current draw from an electric motor (1110) may be monitored by a current divider formed across a normal current sense resistor (1115), as shown in FIG. 11.

The exemplary systems that use current mode ADCs described herein are merely exemplary of the many different systems that may be used with current mode ADCs. Hence, the scope of the present application includes all systems that include current mode ADCs having the architecture described herein.

The preceding description has been presented only to illustrate and describe embodiments of the invention. It is not intended to be exhaustive or to limit the invention to any precise form disclosed. Many modifications and variations are possible in light of the above teaching.

What is claimed is:

1. A current measuring system for producing a digital representation of an electrical current from an electrical component configured to provide an electrical current representative of a parameter of interest at an output node, said system comprising;
   an analog to digital converter having a current input node for electrical communication with said output node of said electrical component;
   wherein said analog to digital converter comprises a differential current comparator that is configured to compare said electrical current from said current input node with one or more reference currents to produce a digital representation of said electrical current; and
   wherein said differential current comparator comprises a separate current comparator circuit for comparing each said reference current to said electrical current from said current input node, each said current comparator circuit comprising a pair of cross-coupled metal oxide semiconductor (MOS) inverters such that a source of an nMOS transistor in each said inverter is electrically coupled to a respective current mirror, a first of said current mirrors being configured to mirror said electrical current from said current input node and a second of said current mirrors being configured to mirror said reference current corresponding to said comparator circuit.

2. The system of claim 1, wherein said analog to digital converter comprises at least one output node configured to convey the digital representation of said electrical current representative of said parameter of interest.

3. The system of claim 1, wherein said analog to digital converter further comprises a plurality of reference current inputs for receiving a plurality of different reference currents to be compared with said electrical current received from said electrical component.

4. The system of claim 1, further comprising a current divider circuit configured to route an amount of electrical current to said current input node of said analog to digital converter that is proportional to a total current provided by said electrical component.

5. The system of claim 1, wherein said electrical component comprises a transformer coil configured to provide an induced electrical current to the analog to digital converter.

6. The system of claim 1, wherein said parameter of interest is selected from the group consisting of temperature measurements, optical measurements, current measurements, battery power, antenna readings, and combinations thereof.

7. The system of claim 1, wherein said electrical component is selected from the group consisting of: temperature sensors, antennas, optical sensors, other sensors, electrical coils, batteries, resistors, inductors, current dividers, and combinations thereof.

8. A system of measuring current, comprising:
   an analog to digital converter having a current input node, a current output node, and a digital output node;
   a reference current source for outputting a plurality of different reference currents to said analog to digital converter,
   wherein said analog to digital converter comprises a differential current comparator that is configured to compare an input current received at said current input node with said plurality of different reference currents to produce a digital representation of said input current,
   wherein said differential current comparator comprises a separate current comparator circuit for comparing each said reference current to said electrical current from said current input node, each said current comparator circuit comprising a pair of cross-coupled metal oxide semiconductor (MOS) inverters such that a source of an nMOS transistor in each said inverter is electrically coupled to a respective current mirror, a first of said current mirrors being configured to mirror said electrical current from said current input node and a second of said current mirrors being configured to mirror said reference current corresponding to said comparator circuit, and
   wherein said analog to digital converter is further configured to output said digital representation of said input current at said digital output node.

9. The system of claim 8, wherein said reference current source comprises a single current source and a current mirror for converting an output from said single current source into said plurality of different reference currents.

10. The system of claim 8, wherein said electrical current is representative of a parameter of interest.

11. The system of claim 10, wherein said parameter of interest is selected from the group consisting of temperature measurements, optical measurements, current measurements, battery power, antenna readings, and combinations thereof.

12. The system of claim 8, wherein an impedance between said current input node and said current output node is set to a fixed value.

13. A method of obtaining a digital representation of an analog current signal, said method comprising:

providing an analog to digital converter having a current input node;

providing an electrical current representative of a parameter of interest at said current input node of said converter;

deriving a digital representation of a measurement of said electrical current in said analog to digital converter by comparing said electrical current to one or more reference currents using a differential current comparator; and providing said digital representation at an output node of said converter;

wherein said differential current comparator comprises a separate current comparator circuit for comparing each said reference current to said electrical current from said current input node each said current comparator circuit comprising a pair of cross-coupled metal oxide semiconductor (MOS) inverters such that a source of an nMOS transistor in each said inverter is electrically coupled to a respective current mirror, a first of said current mirrors being configured to mirror said electrical current from said current input node and a second of said current mirrors being configured to mirror said reference current for said comparator circuit.

14. The method of claim 13, further comprising providing a return path for said electrical current.

15. A light sensing system, comprising a photodiode in communication with an apparatus operating according to the method of claim 13.

16. An electromagnetic energy sensing system, comprising an antenna in communication with an apparatus operating according to the method of claim 13.

17. A system for sensing battery power, comprising a battery in communication with an apparatus operating according to the method of claim 13.

18. A system for inductively sensing a current in an electrical conductor, comprising a transformer disposed around said electrical conductor and in communication with an apparatus operating according to the method of claim 13.

19. A temperature sensing system, comprising a temperature sensor in communication with a system operating according to the method of claim 13.

20. A direct current motor monitoring system, comprising a direct current motor in communication with a system operating according to the method of claim 13.

* * * * *